United States Patent [19]
Hodos

[11] Patent Number: 5,295,777
[45] Date of Patent: Mar. 22, 1994

[54] WAFER TRANSPORT MODULE WITH ROTATABLE AND HORIZONTALLY EXTENDABLE WAFER HOLDER

[75] Inventor: Julian Hodos, Howard Beach, N.Y.

[73] Assignee: Materials Research Corporation, Orangeburg, N.Y.

[21] Appl. No.: 996,102

[22] Filed: Dec. 23, 1992

[51] Int. Cl.⁵ .............................................. B65G 49/06
[52] U.S. Cl. ................................... 414/217; 414/783; 414/936; 414/939; 414/941
[58] Field of Search .................. 414/936, DIG. 2, 939, 414/DIG. 5, 941, DIG. 7, 783, 217; 198/409, 468.4

[56] References Cited
U.S. PATENT DOCUMENTS

| | | |
|---|---|---|
| 3,756,939 | 9/1973 | Hurwitt . |
| 4,241,698 | 12/1980 | Vitale . |
| 4,405,435 | 9/1983 | Tateishi et al. . |
| 4,498,833 | 2/1985 | Hertel . |
| 4,634,331 | 1/1987 | Hertel . |
| 4,655,676 | 4/1987 | Jannborg et al. . |
| 4,670,126 | 6/1987 | Messer et al. . |
| 4,674,621 | 6/1987 | Takahashi . |
| 4,675,096 | 6/1987 | Tateishi et al. . |
| 4,735,540 | 4/1988 | Allen et al. . |
| 4,747,928 | 5/1988 | Takahashi et al. . |
| 4,778,331 | 10/1988 | Kimata et al. . |
| 4,778,332 | 10/1988 | Byers et al. . |
| 4,795,299 | 1/1989 | Boys et al. . |
| 4,836,905 | 6/1989 | Davis et al. . |
| 4,851,101 | 7/1989 | Hutchinson . |
| 4,859,137 | 8/1989 | Bonora ...................... 414/DIG. 5 X |
| 4,892,451 | 1/1990 | Mahler ...................... 414/DIG. 5 X |
| 4,907,931 | 3/1990 | Mallory et al. . |
| 4,923,584 | 5/1990 | Bramhall, Jr. et al. . |
| 4,944,860 | 7/1990 | Bramhall, Jr. et al. . |
| 4,952,299 | 8/1990 | Chrisos et al. . |
| 5,004,399 | 4/1991 | Sullivan ...................... 414/783 X |

FOREIGN PATENT DOCUMENTS 240913 11/1986 Fed. Rep. of Germany .
1465247 3/1989 U.S.S.R. .

Primary Examiner—Richard A. Schacher
Attorney, Agent, or Firm—Wood, Herron & Evans

[57] ABSTRACT

A wafer transport module interconnects a horizontal wafer handler with a vertical wafer processor and includes an evacuatable housing with a first port in communication with the horizontal wafer handler and sized to permit passage of a wafer therethrough in horizontal orientation and a second port in communication with a load/unload station of the vertical wafer processor and sized to permit passage of wafers therethrough in vertical orientation. The transport module includes a wafer holder which supports a wafer on a pedestal and rotates the pedestal and wafer about an inclined axis between horizontal orientation adjacent the first port and vertical orientation adjacent and in alignment with the second port. The wafer holder horizontally extends the vertically oriented platen and wafer from the second position through the second port to the load/unload station of the vertical processor. After wafer processing, the sequence is reversed to return the wafer to the horizontal wafer handler.

11 Claims, 6 Drawing Sheets

WAFER TRANSPORT MODULE WITH ROTATABLE AND HORIZONTALLY EXTENDABLE WAFER HOLDER

FIELD OF THE INVENTION

This invention relates to a transport module used in the manufacture of semiconductor wafers, and more particularly, to a wafer transport module which conveys a wafer between a horizontal wafer handling apparatus and a vertical wafer processing apparatus.

BACKGROUND OF THE INVENTION

The manufacture of semiconductor substrates, or wafers, requires a vacuum environment free of contaminants. Particulate and/or dust generated during handling or processing can destroy a wafer. To reduce the susceptibility of wafers to particulate contamination, it is preferable to process wafers while they are held in vertical orientation.

Applicant's U.S. Pat. No. 4,909,695 discloses a vertical wafer processing apparatus which includes a load/unload station and a plurality of processing stations spaced equidistantly around a horizontal axis. The vertical wafer processing apparatus carrier includes at least one wafer holding ring which holds a wafer in vertical orientation, with preferably one wafer holding ring for each of the stations. To process the wafers, the carrier rotates the wafers successively, in carrousel fashion, to each of the processing stations. One processing step is performed at each station, and the process begins and ends at the load/unload station.

Another type of wafer processing apparatus includes a central horizontal wafer handling module or apparatus connected to a plurality of wafer processing modules which are connectable around the outside of the wafer handling module. The horizontal wafer handling apparatus includes a robot arm which is extendable into any of the other processing modules to transfer a wafer therein for the performance of a desired process on the wafer. With a wafer processing system of this type, versatility in processing various types of wafers is achieved and throughput is increased because the wafer robot can move each wafer into and out of one or more of the modules according to any selected processing sequence. Also, the surrounding processing modules can be changed to suit the particular types of wafer processing needed. Applicant's U.S. Pat. No. 5,154,730 discloses a sputtering module which is connectable to a horizontal wafer handling apparatus of this type.

Unfortunately, for some wafer manufacturing applications, this approach slows down throughput, because only one manufacturing step occurs in each of the modules. While additional modules can be connected to the handler module, or an additional handler module can be added, this increases the overall complexity of the system and also increases space requirements.

It is an objective of this invention to combine the contaminant-free benefits of a vertical wafer processing apparatus with the enhanced versatility in processing capability provided by a horizontal wafer handling apparatus.

It is another objective of the invention to simultaneously achieve a high degree of wafer processing versatility and wafer processing throughout with only minimum space requirements.

The above-stated objectives are met by a wafer transport module which interconnects a horizontal wafer handler with a vertical wafer processor. The wafer transport module of this invention includes a housing which houses a wafer holder and a first port in communication with the horizontal wafer handler and sized to permit passage therethrough of a wafer in horizontal orientation. The wafer transport module also includes a second port in communication with the vertical wafer processor and sized to permit passage therethrough of a wafer in vertical orientation, parallel with a wall of the housing in which the second port is formed.

The wafer holder receives wafers in horizontal orientation from a robot in the horizontal wafer handler, secures the wafer to a horizontal pedestal, rotates the wafer and pedestal about an inclined axis to vertical orientation, and then horizontally extends the vertically held wafer out of the transport module to a load/unload station of the vertical wafer processor.

Because the wafer holder used in this wafer transport module rotates about an inclined axis, one rotational movement moves the wafer from horizontal orientation adjacent the first port to vertical orientation aligned with and adjacent the second port. The wafer holder then horizontally extends the vertically held wafer through the second port and into a load/unload station for transfer to the vertical wafer processor. After wafer processing is complete, the sequence is reversed to return the wafer to the horizontal wafer handler.

This transport module effectively interconnects a horizontal wafer handler with a vertical wafer processor, while occupying only a minimal amount of space. This wafer transport module provides a marriage between a horizontal wafer processing and/or handling system and a vertical wafer processing and/or handling system, thereby enabling a wafer manufacturer to maximize wafer throughput, optimize versatility in selecting a desired sequence of processing steps and also to operate with minimal wafer susceptibility to contamination from particulate.

According to a preferred embodiment of the invention, a wafer transport module for interconnecting a horizontal wafer handling apparatus with a vertical wafer processing apparatus includes an evacuatable housing with first and second ports formed in adjacent side walls thereof. The first port communicates with a horizontal wafer handling apparatus and is sized to permit passage therethrough of a wafer in horizontal orientation. The second port communicates with a load/unload station of a vertical wafer processing apparatus, and the second port is sized to permit passage therethrough of a wafer in vertical orientation and parallel with the side wall through which the second port is formed.

The wafer transport module further includes a wafer holder with a wafer retaining pedestal. The wafer holder is mounted to an inclined turret and rotatable with respect to the turret to move the wafer holder and pedestal between horizontal orientation and vertical orientation, and vise versa. The wafer transport module also includes a piston mounted to a side wall of the housing located opposite the second port. When the wafer holder and pedestal are in vertical orientation and aligned with the second port, the piston horizontally extends and retracts the wafer holder and pedestal through the second port and into the load/unload station of the vertical wafer processing apparatus.

The wafer holder further includes a plurality of pins which are extendable outwardly from and retractable into the pedestal. The pins are carried on a plate located below the pedestal and within the wafer holder. When the pedestal is horizontal and the pins are extended, a wafer may be received on the pins through the first port via a robot arm extended therethrough from the horizontal wafer handler. As the pins retract, the wafer lowers to the pedestal until the backside surface of the wafer is supported thereon.

A plurality of clamps are located radially outside of the pedestal. The clamps move between a radially outward open position and a radially inward closed position. When in the closed position, the clamps engage the front surface of the wafer adjacent its perimeter. When the pins are extended, the clamps are in the open position.

With the wafer retained on the pedestal by the clamps and the pedestal and wafer oriented horizontally and adjacent the first port, the wafer holder may rotate about the inclined axis to move the pedestal and wafer into vertical orientation, in alignment with the second port. Thereafter, the piston horizontally extends the wafer holder, including the pedestal and the wafer retained thereon, through the second port.

Upon horizontal extension through the second port, the front surface of the wafer contacts spring-biased tabs supported by a wafer holding ring carried by the vertical wafer processing apparatus. With the wafer engaged on its front surface by the tabs, a plurality of actuators carried by the wafer holder and located radially outside of the pedestal interact with the wafer holding ring of the vertical wafer processor to rotate rollers held by the ring into engagement with the rear surface of the wafer. The rollers rotate into cutout regions in the side of the pedestal to move behind the wafer without interfering with the pedestal itself. With the wafer held in vertical orientation between the rollers and the tabs of the wafer holding ring, the clamps move radially outwardly to their open positions. The wafer holder ring has internal radially directed notches formed therein to enable the clamps to move radially outwardly without interfering with the wafer holding ring itself. The wafer holder then withdraws into the module. A gate valve may then be closed to isolate the transport module from the vertical wafer processor.

After the first wafer is transferred to the vertical wafer processor, another wafer may be obtained from the horizontal wafer handler and then transferred to the next wafer holding ring of the vertical wafer processor. This process continues until all of the wafer holding rings of the vertical wafer processor hold a wafer.

After processing of a wafer by the vertical processing apparatus is complete, the above-described sequence is reversed. First, with the already processed wafer located at the load/unload station of the vertical wafer processing apparatus, the gate valve is opened. The wafer holder then extends horizontally through the second port to a position adjacent the backside of wafer. The clamps are then radially inwardly closed into contact with the front surface of the wafer. The actuators carried by the wafer holder then rotate the rollers out of contact with the backside surface of the wafer, so that the wafer is held in vertical orientation against the pedestal by the clamps. The wafer holder then horizontally retracts through the second port and into the housing. After retraction, the wafer holder rotates the wafer and the pedestal about the inclined axis from vertical orientation to horizontal orientation and adjacent the first port. The clamps are then moved radially outwardly from the wafer. The plate then moves upwardly to extend the pins and to raise the wafer upwardly from the pedestal, thereby to enable the robot arm to retrieve the wafer back into the horizontal wafer handling apparatus.

Preferably, the timing and sequence of operation for the pins, the clamps, the actuators, rotation of the wafer holder and extension and retraction of the wafer holder are controlled by a single programmable controller. Preferably, this controller is operatively connected to a master controller which coordinates the entire sequence of wafer processing and handling operations performed by the vertical wafer processing apparatus, the wafer transport module and the horizontal wafer handling apparatus, and any other wafer handling and/or processing apparatus or modules interconnected therewith.

These and other features of the invention will be more readily understood in view of the following detailed description and the drawings.

DETAILED DESCRIPTION OF THE DRAWINGS

Figure 1:
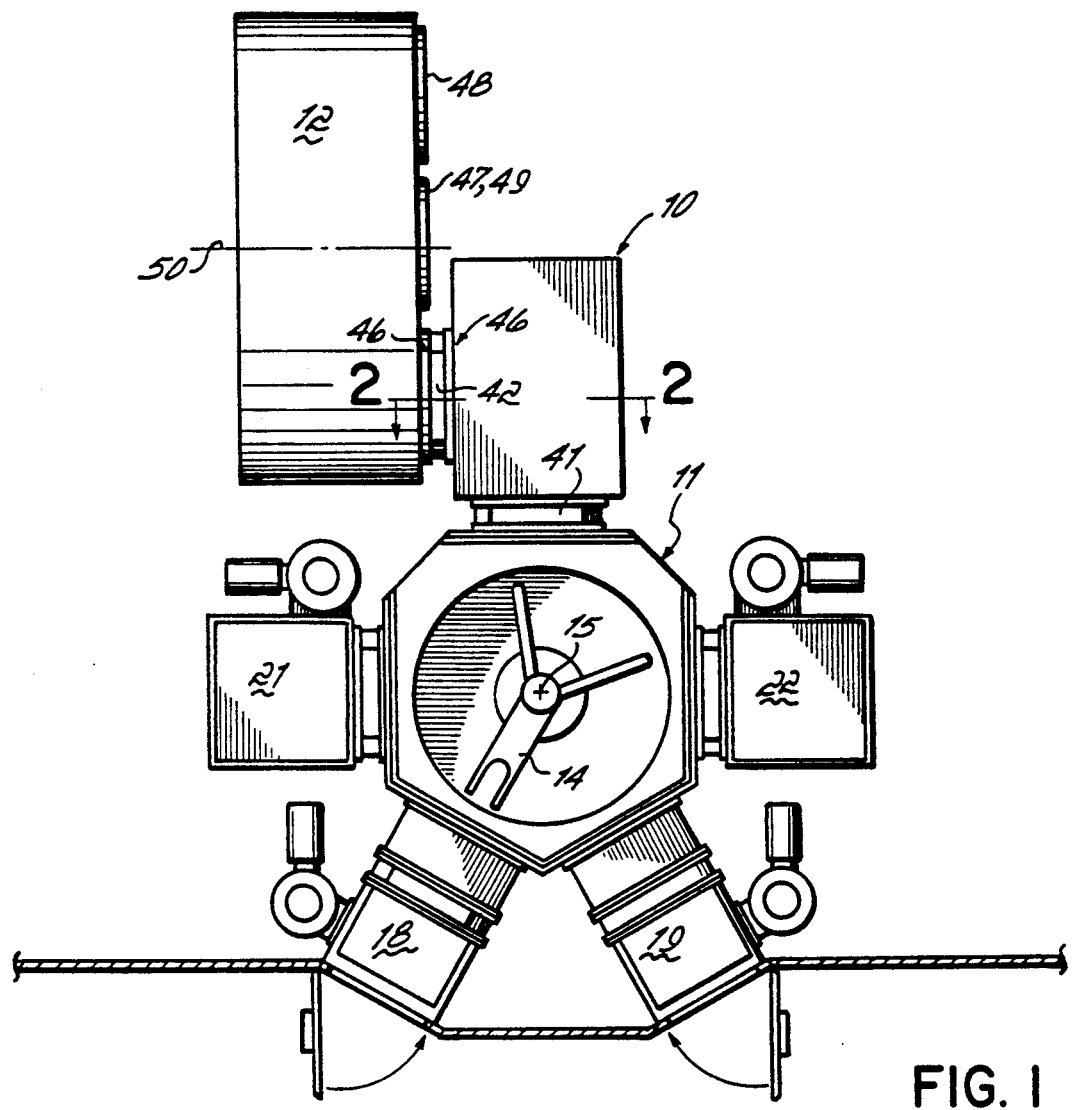
FIG. 1 is a schematic plan view of a wafer processing system which includes a wafer transport module interconnected between a horizontal wafer handling apparatus and a vertical wafer processing apparatus in accordance with a preferred embodiment of the invention.

FIG. 1 shows a wafer transport module 10 interconnected between a horizontal wafer handling apparatus 11 and a vertical wafer processing apparatus 12 in accordance with a preferred embodiment of the invention. The horizontal wafer handling apparatus 11 includes a centrally located robot ar 14 which is rotatable about a central axis 15 and radially extendable outward from and retractable toward the central axis 15 to move a single wafer between the various other wafer handling modules interconnected therewith.

FIG. 1 shows one particular configuration for a wafer processing system which employs the module 10 of this invention. FIG. 1 shows two load/lock modules 18 and 19 connected to the wafer handling apparatus 11. Each of the load/lock modules 18 and 19 includes a cassette which holds a plurality of horizontally stacked wafers (not shown) Additional wafer processing modules 21 and 22 are connected to the horizontal wafer handling apparatus 11. As indicated above, if desired, a wafer processing system may include additional interconnected modules of this type to provide optimum wafer processing capability and versatility. The configuration of the modules and the sequence of operation will be determined by the type of wafer to be processed.

The wafer transport module 10 of this invention allows the advantages of a wafer system of this type to be combined with the advantages of a contaminant-free environment provided by a vertical, carrousel-type wafer processing apparatus 12. While the wafer transport module 10 of this invention is particularly advantageous when interconnecting a carrousel-type vertical wafer processing apparatus 12 with a horizontal wafer handling apparatus 11, as shown in FIG. 1, it is also to be understood that this wafer transport module 10 may be used to interconnect any horizontal wafer processing or handling modules/apparatus with another vertical wafer handling or processing module/apparatus.

Figure 2:
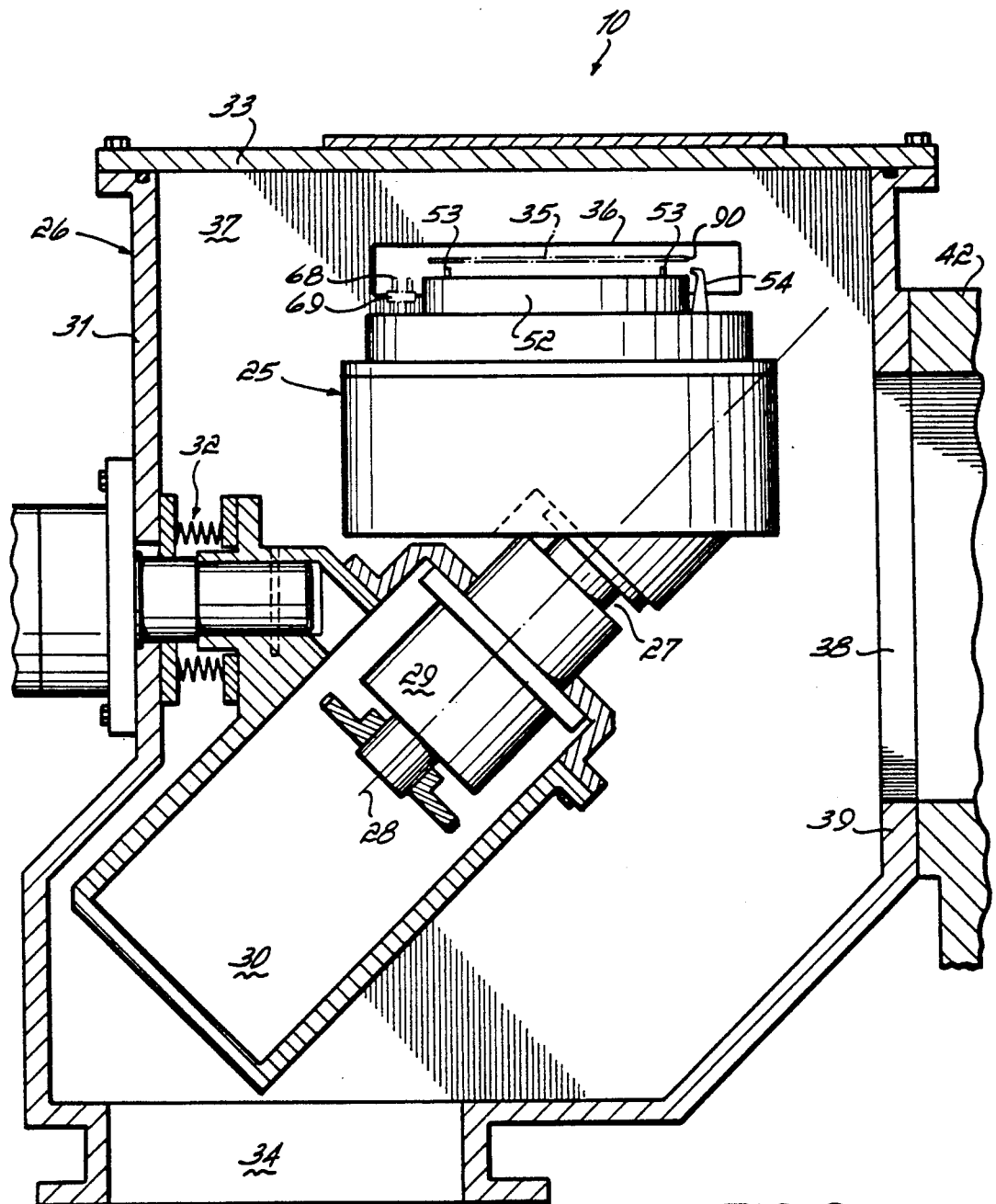
FIG. 2 is a cross-sectional view taken along lines 2—2 of FIG. 1, which shows a wafer holder in the wafer transport module rotated into horizontal orientation adjacent a first port in the module, thereby to allow wafer passage therethrough in horizontal orientation between the module and the horizontal wafer handler.

As shown in FIG. 2, the wafer transport module 10 includes a wafer holder 25 mounted inside an evacuatable housing 26. The wafer holder 25 is supported by a shaft or turret 27 oriented at an inclined axis 28 which is preferably angled at about 45° from horizontal. A main rotary feedthrough 29 rotates the turret 27 about axis 28. The wafer holder 25 and turret 27 are mounted to a base 30. A piston 32 connects the base 30 to a side wall 31 of the evacuatable housing 26. The housing 26 further includes a top cover 33 and a bottom opening 34 through which a vacuum pump (not shown) may evacuate the housing 26.

The evacuatable housing 26 includes a first port 36 formed in a first side wall 37. The first port 36 is sized to permit passage therethrough of a wafer 35 in horizontal orientation. More particularly, the first port 36 enables the robot arm 14, while holding a wafer 35, to extend out of horizontal wafer handling apparatus 11 and into the wafer transport module 10. Housing 26 also includes a second port 38 formed in a second side wall 39. The second side wall 39 is located opposite piston side wall 31. Second port 38 is sized to permit passage therethrough of a wafer 35 in vertical orientation, with the wafer 35 positioned parallel with second side wall 39.

Figure 3:
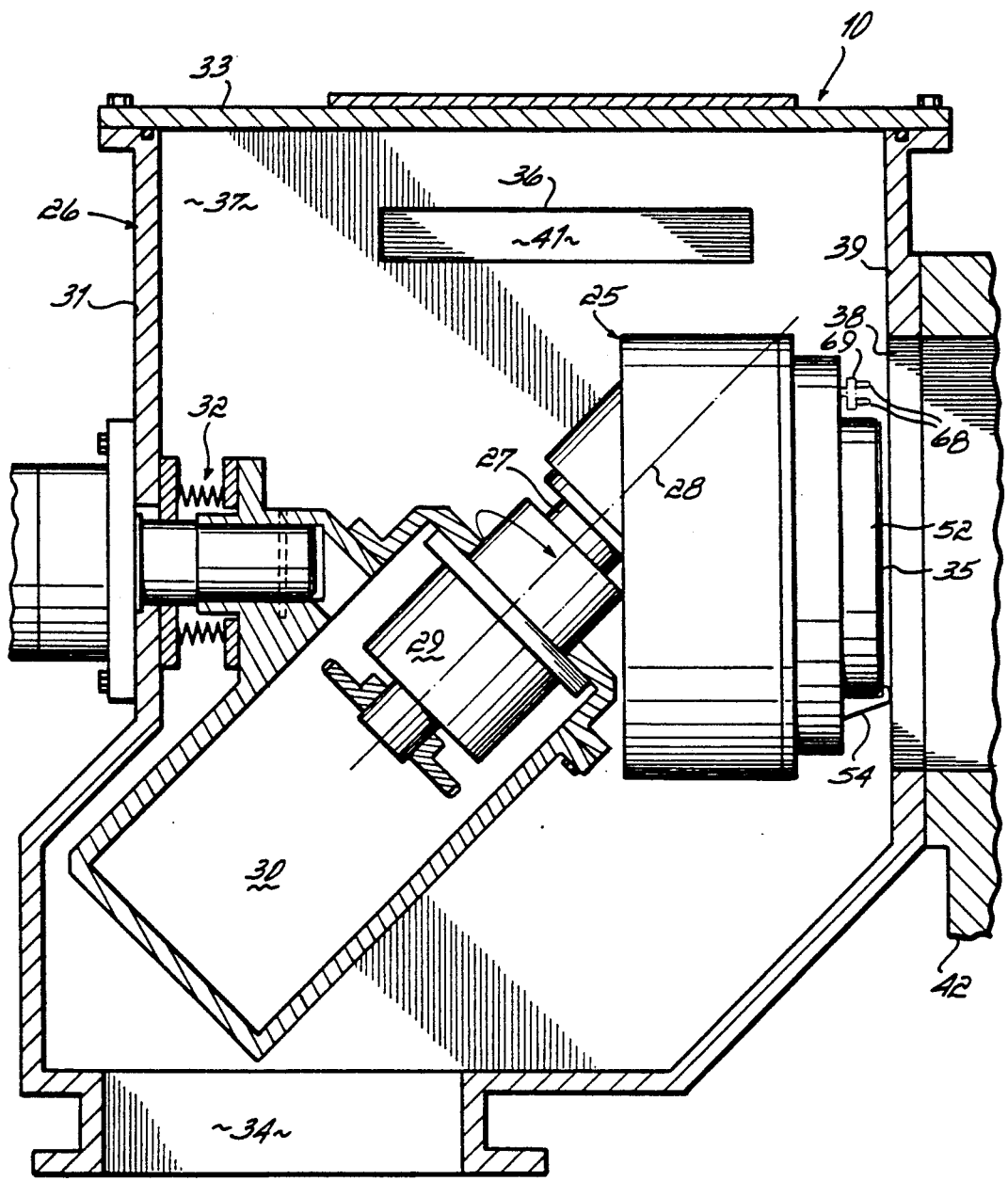
FIG. 3 is a cross-sectional view, similar to FIG. 2, which shows the wafer holder rotated into vertical orientation and aligned with a second port in the module.
Figure 4:
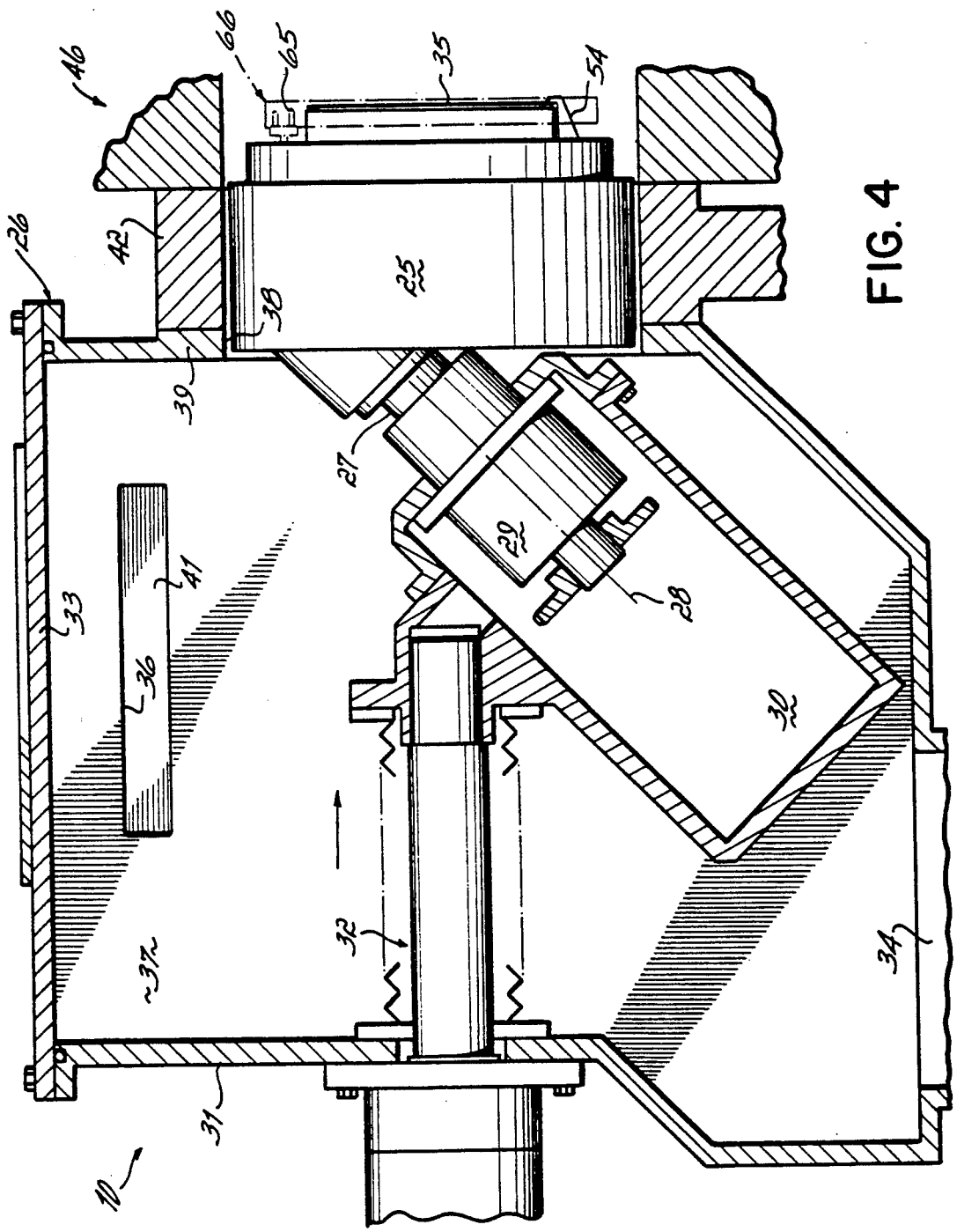
FIG. 4 is a cross-sectional view, similar to FIG. 3, which shows the wafer holder horizontally extended through the second port and into a load/unload station of the vertical wafer processing apparatus.

A wafer 35 enters and leaves the wafer transport module 10 via first port 36 and second port 38. Preferably, a gate valve 41 (FIG. 1) enables first port 36 to be closed to isolate the wafer transport module 10 from horizontal wafer handler 11, and a gate valve 42 enables second port 38 to be closed to isolate the wafer transport module 10 from the vertical wafer processor 12. To move the wafer 35 received through the first port 36 to the vertical wafer processor 12 through second port 38, the wafer holder 25 rotates the wafer 35 about inclined axis 28 into vertical orientation and in alignment with second port 38, as shown in FIG. 3. Then, piston 32 horizontally extends base 30, turret 27 and wafer holder 25 through the second port 38 and into a load/unload station 46 of the vertical wafer processor 12, as shown in FIG. 4. The vertical wafer processor 12 includes additional wafer processing stations 47, 48 and 49 through which the wafer 35 may be successively moved about an axis 50 in carrousel-type fashion to perform wafer processing steps. The wafer processing steps performed by the vertical wafer processor 12 are complete when the wafer 35 is returned to the load/unload station 46.

Figure 5:
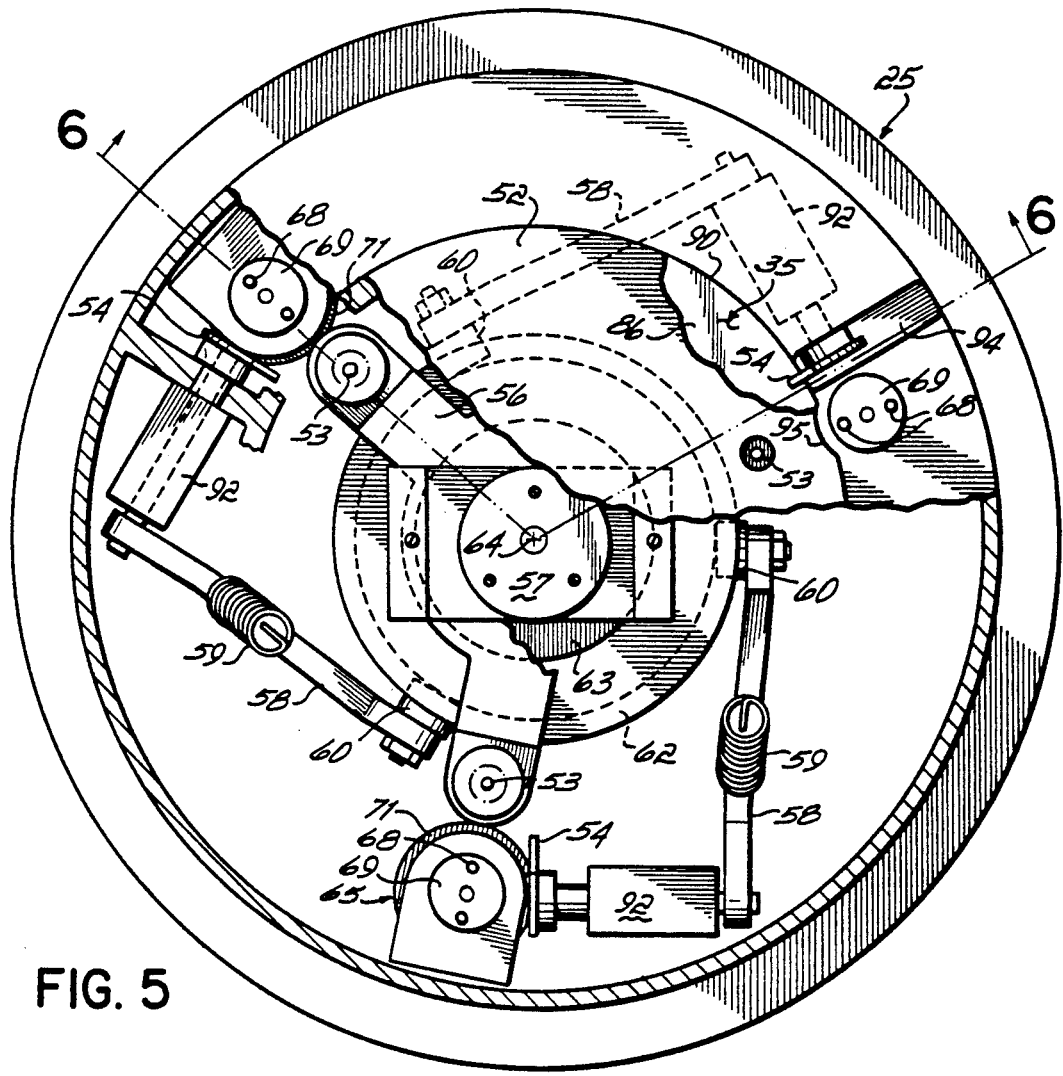
FIG. 5 is a top elevational view partially in cross section of the wafer holder shown in FIGS. 2, 3 and 4.
Figure 6:
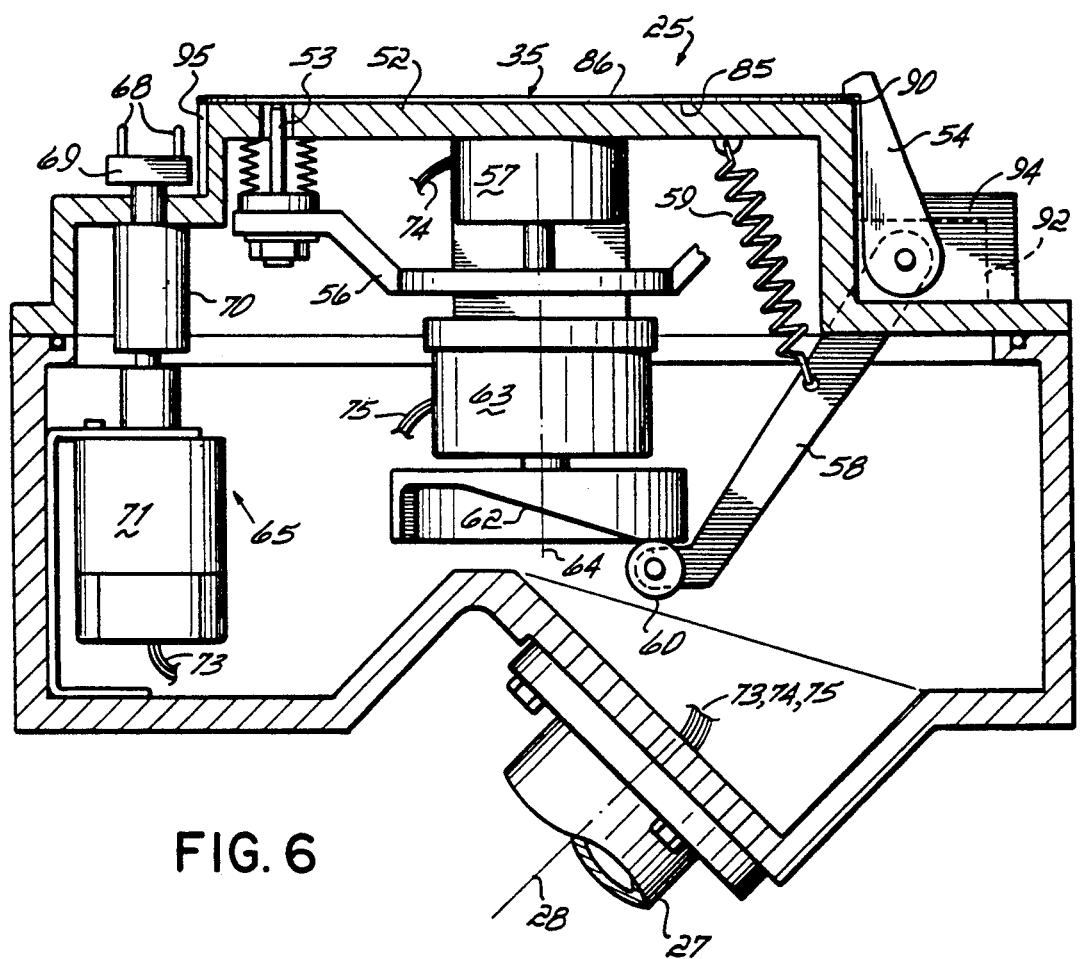
FIG. 6 is a cross sectional view of the wafer holder taken along lines 6—6 of FIG. 5.

As shown in FIG. 5 and 6, the wafer holder 25 includes a pedestal 52 which contacts a backside of the wafer 35 during transport. A plurality of pins 53, preferably three, are housed within the pedestal 52. The pins 53 are adapted to extend outwardly from the pedestal 52 and retract inwardly into the pedestal 52. Preferably, the pins 53 are mounted to a plate 56 which is oriented substantially parallel with and behind the pedestal 52. Plate 56 mounts to an inner linear actuator 57 which is bracketed to the bottom of pedestal 52. Plate 56 is adapted to move toward and away from the pedestal 52 by actuator 57, thereby to extend and to retract, respectively, the pins 53 with respect to the pedestal 52. The pins 53 are extended and retracted when the pedestal 52 is in horizontal orientation, adjacent the first port 36. When raised, or extended, the pins 53 allow the robot arm 14 to move the wafer 35 through port 36 to a position above the pins 52. The robot arm 14 (FIG. 1) then lowers the wafer 15 onto the pins 53. Retraction of the pins 53 via downward movement of the plate 56 places the wafer 35 directly on the pedestal 52.

The wafer holder 25 also includes a plurality of clamps 54, preferably three, located radially outside of the pedestal 52. The clamps 54 move radially between an outer, open position and on inner, closed position. When in the closed position, the clamps 54 contact the front surface of the wafer 35 around its periphery to retain the wafer 35 on the pedestal 52.

Each clamp 54 is connected to a lever 58 which extends under pedestal 52 and within wafer holder 25. Each lever 58 is spring biased upwardly by a spring 59, to hold a cam roller 60 at the bottom end of the respective lever 58 in engagement with an arcuate cam surface 62 of a central rotary actuator, or camming device 63. The camming device 63 is mounted to bracket 57 and rotatable about a center axis 64 through the pedestal 52. This rotation causes the arcuate cam surfaces 62 to raise or lower the cam rollers 60 to raise or lower the levers 58 toward or away from the pedestal 52, respectively, thereby to open or close the respective clamps 54. With the wafer 35 held tightly to the pedestal 52 by the clamps 54, the wafer holder 25 may be rotated 180° about the inclined axis 28 to move the wafer 35 between horizontal and vertical orientation.

The wafer holder 25 also includes plurality of actuators 65 which are located radially outside of the pedestal 52. The actuators 65 cooperate with a wafer handling ring 66 (FIG. 4) of the vertical wafer processor 12 at the load/unload station 46 to affect transfer of the wafer 35 between the wafer transport module 10 of this invention and the vertical wafer processor 12.

More particularly, the actuators 65 include a pair of tines 68 connected to an actuator head 69. As shown in FIG. 6, the actuator head 69 connects to a rotary feedthrough 70, which is driven by a rotary actuator 71. The actuator 71 is driven electrically by electrical signals supplied via cable 73. Cable 73 and the other cables 74 and 75 which convey the electrical power signals to linear actuator 57 and central camming device 63, respectively, are preferably routed through turret 27, through base 30 and out of housing 26 via piston 32.

Figure 7:
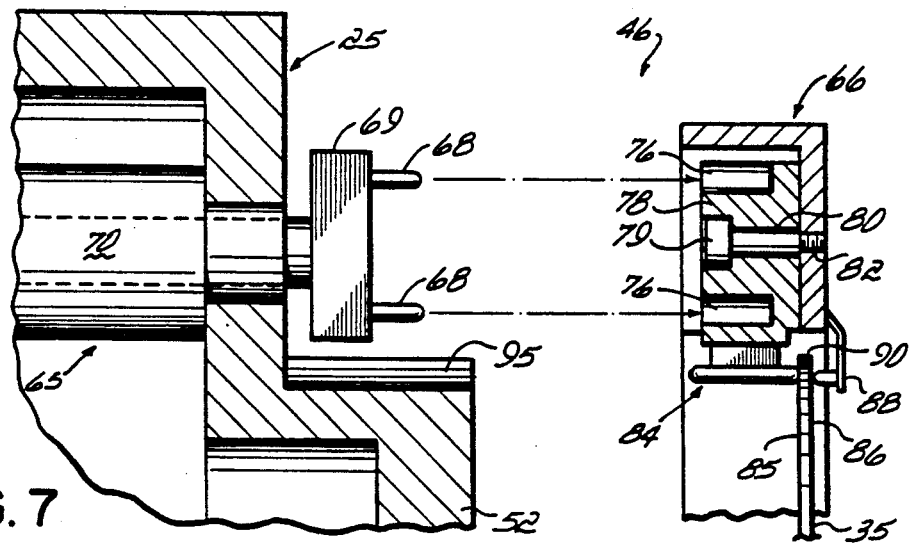
FIG. 7 is an enlarged cross sectional schematic of one set of the components of the transport module and the vertical wafer processor which coact to offset wafer transfer at the load/unload station.

As shown in FIG. 7, when the wafer holder 25 is moved into load/unload station 46, the tines 68 move into hollow recesses 76 in a support member 78 which is held to wafer holding ring 66 by a bolt 79 which extends through a sleeve 80 and threadably connects to the ring 66 via a threaded bore 82. The sleeve 80 enables the support member 78 to rotate with respect to ring 66.

The support member 78 supports a roller 84 which, upon rotation of tines 68, rotates into contact with a backside surface 85 of the wafer 35. A front surface 86 of the wafer 35 is held by a spring-loaded tab 88, in opposition to the roller 86. This step occurs at each of three positions spaced around the pedestal 52.

FIG. 5 shows the relative positions of the three vertical rotary feedthroughs 70 with respect to the three pins 53. While three sets of rotary feedthroughs 70 and pins 53 are depicted, it is to be understood that the invention contemplates additional pins 53 and feedthroughs 70, if desired. One of the clamps 54 is associated with each of the sets of pins 53 and rotary feedthroughs 70. Again, as shown in FIG. 5, three clamps 54 are depicted, but this number could be increased if desired. The clamps 54 move radially inwardly with respect to axis 64 to a closed position (FIG. 6) in contact with the wafer 35. The position occupied by the edge of wafer 3 is designated by reference numeral 90. In the open position (FIG. 2), the clamps 54 are located radially outside the edge 90 of wafer 35.

As noted previously, each clamp 54 connects to a lever 58, a spring 59, and a cam roller 60 which rides on a cam surface 62 of central rotary actuator 63. Additionally, a plurality of rotary feedthroughs 92 are provided for interconnecting the levers 58 with the respective clamps 54. The rotary feedthroughs 92 are located within the wafer holder 25, but extend outwardly in a tangential direction with respect to pedestal 52 and axis 64, and each of the rotary feedthroughs 92 extends into a cutout region 94 in which the respective clamp 54 resides. As is known in the art of wafer processing, a rotary feedthrough provides a suitable interface for a movable part which must be moved in a vacuum environment. Each of the three cutout regions 94 enables a rotary feedthrough 92 to couple a clamp 54 located outside of the wafer holder 25 with a respective lever 54 located inside the wafer holder 25. Arcuate clearance notches 95 also extend radially inwardly beyond edge 90 of wafer 35 a sufficient distance to allow the actuator rotary feedthroughs 70 to rotate the rollers 84 of the wafer holding ring 66 behind the wafer 35 while at the load/unload station 46.

In operation, the robot arm 14, with a wafer 35 supported thereon and the gate valve 41 open, extends from horizontal wafer handler 11 through port 36 to a position located above the upwardly extended pins 53 of wafer holder 25. The robot arm 14 moves downwardly to place the wafer 35 on the pins 53. Robot arm 14 then retracts through port 36 and gate valve 41 closes.

Retraction of the pins 53 places the wafer 35 directly on the pedestal 52. Thereafter, camming device 63 rotates about axis 64 so that cam surfaces 62 act upon cam rollers 60 to move the levers 58 away from the pedestal 52, thereby moving the clamps 54 radially inwardly into contact with the top of the wafer 35. Wafer holder 25 then rotates about axis 28 to position the pedestal 52 and the retained wafer 35 in vertical orientation and aligned with the second port 38. Thereafter, with gate valve 42 open, piston 32 horizontally extends base 30, turret 27 and wafer holder 25 so that the wafer holder 25, the pedestal 52 and the wafer 35 move horizontally through port 38 and into load/unload station 46 of the vertical wafer processor 12. In this position, the front surface of the wafer 35 is located adjacent, or in contact with, at least three spring-loaded tabs 88 mounted on the wafer holding ring 66.

Horizontal movement of wafer holder 25 also moves tines 68 of the actuator heads 69 into hollow regions 76 of the support member 78 which is rotatably secured to wafer holding ring 66. Rotation of the actuators 70 rotates the tines 68 and the respective support members 78 to move the rollers 84 through the arcuate clearance notches 95 in the pedestal 52 and into contact with backside surface 85 of the wafer 35. With the wafer 35 engaged between the rollers 84 and the spring-loaded tabs 88, camming device 63 is again rotated about axis 64 to move the cam rollers 60 and their respective levers 58 toward pedestal 52, thereby to move the clamps 54 radially outwardly beyond outer edge 90. The piston 32 then horizontally retracts the wafer holder 25 through second port 38 and back into housing 26, and gate valve 42 closes to isolate the wafer transport module 10 from the vertical wafer processor 12.

Wafer holder 25 may then be rotated back to horizontal orientation to receive another wafer 35 from the horizontal wafer handler 11. This next wafer 35 is also rotated into vertical orientation, and then extended through port 38, in similar fashion, to be transferred to the next wafer holding ring 66 mounted on the carrousel (not shown) of the vertical wafer processor 12. This process may continue in similar fashion until four wafers 35 have been moved to the vertical wafer processor 12. If the vertical wafer processor 12 has more than four stations, including the load/unload station 46, then more than four wafers 35 may be transferred to the vertical wafer processor 12 in this manner.

After the vertical wafer processor 12 has been fully loaded with one wafer 35 for each of the stations, a processed wafer will be returned to the load/unload station 46 upon the next rotation of the carrousel. The wafer holder 25 then retrieves the wafer 35 back into the housing 26, rotates the wafer 35 back into horizontal orientation and extends the wafer 35 vertically upwardly in horizontal orientation for retrieval by the robot arm 14. The wafer holder may then wait for another wafer 35 to be transferred to the empty wafer holding ring 66 at the load/unload station 46, or the wafer holder 25 may be rotated about axis 28 and then extended horizontally through second port 38 and into load/unload station 46 to retrieve the next wafer 35 held by the next wafer holding ring 66. This process may then continue until all of the wafers 3 processed by the vertical wafer processor have been singly returned to the horizontal wafer handler 11, leaving the vertical processor 11 empty.

The particular sequence of moving wafers 35 between horizontal wafer handler 11 and vertical wafer processor 12 may vary, depending upon the types of wafers 35 to be produced and the particular organization and sequence of all of the wafer handling and processing modules.

Having described the invention in the context of illustrated and preferred embodiments, those skilled in the art will appreciate that variation may be made without departing from the concepts of the invention.

I claim:

1. A wafer transport module for conveying a wafer between a horizontal wafer handling apparatus and a vertical wafer processing apparatus.
   an evacuatable housing having a first port in communication with the horizontal wafer handling apparatus and a second port in communication with the vertical wafer processing apparatus, the first port sized to permit passage of a wafer therethrough in horizontal orientation and the second port sized to permit passage therethrough of a wafer in vertical orientation;

a wafer holder located in the housing, the wafer holder adapted to receive and retain a wafer in horizontal orientation adjacent the first port;

means for rotating the wafer holder about an inclined axis to position the retained wafer in vertical orientation and in alignment with the second port; and means for horizontally extending the wafer holder through the second port and into a load/unload station of a vertical wafer processing apparatus, thereby to facilitate transfer to the vertical wafer processing apparatus.

2. The wafer transport module of claim 1 wherein the wafer holder further comprises:

a pedestal on which the wafer is received and retained;

a plurality of pins located within the pedestal, the pins being extendable outwardly from the pedestal and retractable therein; and a plurality of clamps movable into and out of contact with a front surface of the wafer when a backside surface of wafer is in contact with the pedestal and the pins are retracted.

3. The wafer transport module of claim 2 wherein the wafer holder further comprises:

a plurality of actuators located radially outside of the pedestal, the actuators adapted to coact with the vertical processing apparatus at the load/unload station to cause engagement of the backside surface of the wafer to facilitate transfer of the wafer to and from the vertical processing apparatus.

4. The wafer transport module of claim 1 wherein the means for horizontally extending includes a piston located opposite the second port and in alignment therewith.

5. The wafer transport module of claim 4 wherein the housing has four side walls, the piston and the second port being located at opposite side walls and the first port is formed in a side wall located between said opposite side walls.

6. The wafer transport module of claim 1 wherein the inclined axis is oriented at about a 45° angle with respect to horizontal and the wafer holder rotates 180° to move the pedestal between horizontal and vertical orientation.

7. In combination, the invention comprising:

a carrousel-type vertical wafer processing apparatus for receiving and processing wafers in vertical orientation, the vertical wafer processing apparatus having a plurality of processing stations and a load/unload station to accommodate transfer of a wafer to and from the vertical apparatus;

a horizontal wafer handling apparatus adapted to move a wafer in horizontal orientation, the horizontal wafer handling apparatus having at least one port sized to permit passage of a wafer therethrough in horizontal orientation and wafer support means for extendably moving and retrieving a wafer through the port;

a wafer transport module interconnected between the vertical apparatus and the horizontal apparatus, the module having a first port in communication with said at least one port of the horizontal wafer handling apparatus and a second port in communication with the load/unload station of the vertical wafer processing apparatus; and wafer holding means located in the wafer transport module, the wafer holding means adapted to support and retain a wafer in horizontal orientation adjacent the first port, to rotate the retained wafer through an inclined axis into vertical orientation and in alignment with the second port and to horizontally extend the retained, vertically oriented wafer through the second port and into the load/unload station, thereby to facilitate transport between the vertical wafer processing apparatus and the horizontal wafer handling apparatus.

8. The invention of claim 7 wherein the wafer holding means further comprises:

a pedestal having a wafer support surface for supporting the backside of the wafer while in the module; and actuating means mounted on the wafer holding means radially outside of the pedestal and adapted to cooperate with the vertical wafer processing apparatus to affect transfer of the wafer between the transport module and the vertical wafer processing apparatus.

9. The invention of claim 8 wherein the wafer holding means further comprises:

a plurality of pins extendable outwardly from and retractable into the pedestal; and a plurality of clamps mounted radially outside of the pedestal, the clamps being radially movable to a closed position into engagement with a front surface of the wafer to retain the wafer on the pedestal when the pins are retracted.

10. The invention of claim 9 wherein the wafer holding means further comprises:

a plate substantially parallel with and located opposite the wafer support surface of the pedestal, the plate supporting the pins; and means for moving the plate toward and away from the pedestal to extend and retract the pins, respectively.

11. The invention of claim 10 wherein the wafer holding means further comprises:

a plurality of levers, each lever rigidly connected to one of the clamps;

a plurality of spring means, each spring means adapted to bias a respective clamp to an open position radially outside of the pedestal;

a central actuator located in the wafer holder on a side of the plate opposite the pedestal;

means for rotating the central actuator; and a plurality of cam surfaces at a second end of the central actuator, each of the cam surfaces engaging one of the levers, whereby rotation of the central actuator causes the cam surfaces to move the levers toward or away from the pedestal to open or close the clamps, respectively.

* * * * *

UNITED STATES PATENT AND TRADEMARK OFFICE
CERTIFICATE OF CORRECTION

PATENT NO. : 5,295,777
DATED : March 22, 1994
INVENTOR(S) : Julian Hodos

It is certified that error appears in the above-indentified patent and that said Letters Patent is hereby corrected as shown below:

Column 4, line 57 "ar" should be --arm--.

Column 6, line 19, "15" should be --35--.

Column 7, line 18, "3" should be --35--.

Column 8, line 46, "3" should be --35--.

Signed and Sealed this

Fifth Day of December, 1995

Attest:

BRUCE LEHMAN

Attesting Officer

Commissioner of Patents and Trademarks